United States Patent [19]

Shum

[11] Patent Number: 5,814,983
[45] Date of Patent: Sep. 29, 1998

[54] METHOD FOR SENSING DC CURRENT AND SENSOR FOR CARRYING OUT SAME

[75] Inventor: Kin E. Shum, Los Angeles, Calif.

[73] Assignee: Hughes Electronics Corporation, Los Angeles, Calif.

[21] Appl. No.: 664,929

[22] Filed: Jun. 7, 1996

[51] Int. Cl.$^6$ ................................................. G01R 33/00
[52] U.S. Cl. ..................................... 324/117 R; 324/127
[58] Field of Search ........................... 324/117 R, 117 H, 324/127, 142, 126, 141; 336/175

[56] References Cited

U.S. PATENT DOCUMENTS

| | | | |
|---|---|---|---|
| 3,467,864 | 9/1969 | Vander | 324/117 R |
| 4,126,826 | 11/1978 | Dobkin | 324/117 R |
| 5,196,784 | 3/1993 | Estes, Jr. | 324/127 |

OTHER PUBLICATIONS

Sullender, C.; "Magnetic Current Sensors for Space Station Freedom"; *IEEE*; 1991; pp. 635–641. (unavailable month).

*Primary Examiner*—Vinh P. Nguyen
*Attorney, Agent, or Firm*—Elizabeth E. Leitereg; Terje Gudmestad; Michael W. Sales

[57] ABSTRACT

A method and sensor for accurately measuring DC current includes an electromagnetic circuit component, such as a current transformer, having a saturated state and an unsaturated state which generates a DC current based on the DC current being measured. The current transformer includes a first circuit for generating the DC current being measured. A second circuit is electromagnetically coupled to the first circuit to generate a constant DC offset current so as to minimize error at low levels of the measured DC current. A third circuit is electromagnetically coupled to the first circuit for generating a third DC current representative of the first DC current. The first DC current is then measured based on the third DC current. The measured first DC current is then adjusted based on the added second DC current. A sampling circuit is operatively coupled to the third circuit component for sampling the third DC current during a sampling interval. A one-shot circuit is operatively coupled to the sampling circuit for controlling the sampling interval so that the measured DC current is only sampled when the current transformer is in the unsaturated state.

20 Claims, 2 Drawing Sheets

METHOD FOR SENSING DC CURRENT AND SENSOR FOR CARRYING OUT SAME

TECHNICAL FIELD

This invention relates to a method for sensing DC current and a sensor for carrying out same.

BACKGROUND ART

Aerospace current sensors must be accurate, dependable, stable, light weight and low powered. Magnetic current sensors are typically chosen over resistor shunts and Hall devices due to their stability, weight and power requirements.

The known prior art includes a magnetic current sensor utilizing a current transformer having a primary coil and a secondary coil. A positive voltage is applied to the secondary coil until the magnetic material of the transformer saturates. The transformer is then reset by a negative voltage. The DC current is measured by sampling the voltage output at the secondary coil while the transformer is being reset. However, a high magnetizing current is generated at low DC current which results in a large error.

DISCLOSURE OF THE INVENTION

It is thus a general object of the present invention to provide a method and sensor for accurately measuring DC current, especially at low DC current levels.

In carrying out the above object and other objects, features and advantages of the present invention, a method is provided for accurately measuring DC current in a first circuit. The method includes the step of electromagnetically coupling a second circuit to the first circuit for generating a second DC current for improving the accuracy of the measurement of the first DC current at low levels of the first DC current. The method also includes the step of electromagnetically coupling a third circuit to the first circuit for generating a third DC current representative of the first DC current. The method further includes the step of measuring the first DC current based on the third DC current generated by the third circuit.

In further carrying out the above object and other objects, features and advantages, of the present invention, a sensor is also provided for carrying out the steps of the above described method. The sensor includes a second circuit electromagnetically coupled to the first circuit for generating a second DC current. The sensor also includes a third circuit for generating a third DC current representative of the first DC current. Finally, the system includes a measuring device for measuring the first DC current based on the third DC current.

The above object and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
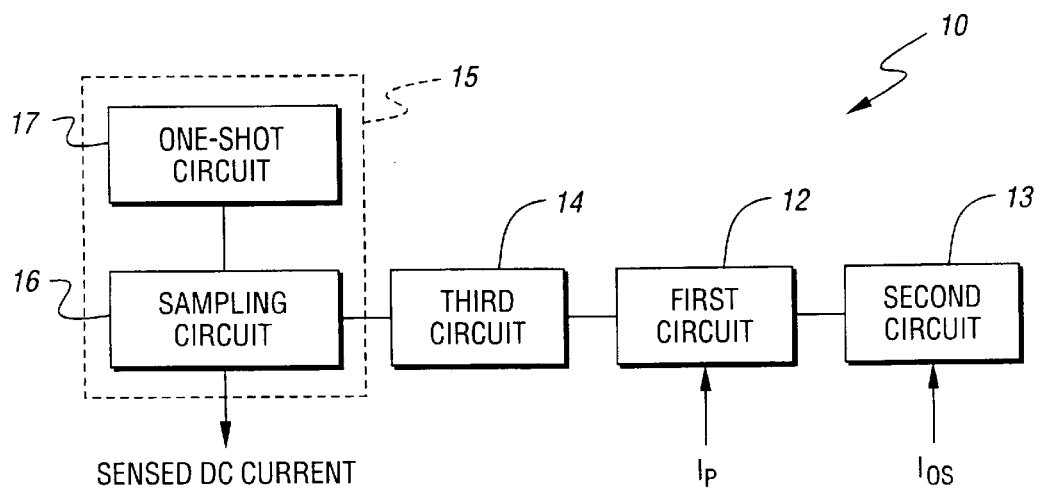
FIG. 1 is a simplified block diagram of the current sensor of the present invention.

Turning now to FIG. 1, there is shown a simplified block diagram of the current sensor of the present invention, denoted generally by reference numeral 10. The current sensor 10 includes a first circuit 12 for generating a first DC current which corresponds to the DC current being sensed or measured. The sensor 10 also includes a second circuit 13 electro-magnetically coupled to the first circuit 12 for generating a second DC current. The second DC current flows in the same direction as the first DC current. The second DC current is introduced for improving the accuracy of the measurement of the first DC current at low levels of the first DC current. The sensor 10 further includes a third circuit 14 electromagnetically coupled to the first circuit 12 for generating a third DC current representative of the first DC current. Finally, the sensor 10 includes a measuring device 15 for measuring the third DC current to obtain the first DC current in the first circuit.

The measuring device 15 includes a sampling circuit 16 for sampling the third DC current during a sampling interval. Coupled to the sampling circuit 16 is a one-shot circuit 17 for controlling the sampling interval of the sampling circuit 16. The sampling interval must be controlled so that an accurate measurement of the first DC current can be obtained.

Figure 2:
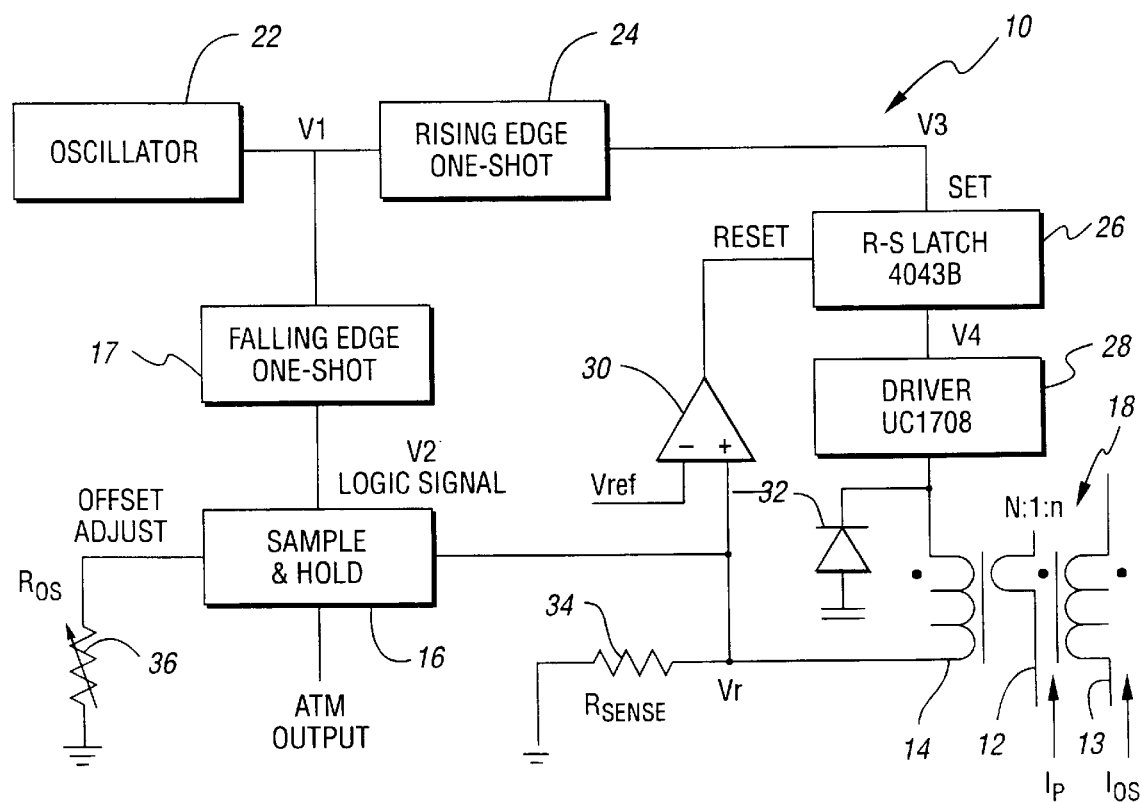
FIG. 2 is a more detailed block diagram of the current sensor shown in FIG. 1.

Turning now to FIG. 2, there is shown a schematic diagram of the current sensor 10 of the present invention. The first circuit 12 is a primary winding and the third circuit 14 is a secondary winding of a current transformer 18. The second circuit 13 is an offset winding in parallel relation to the primary winding 12 for providing an offset DC current. The current transformer 18 has a saturated state and an unsaturated state. That is, the DC current produced by the current transformer 18 lasts only until the magnetic material of the current transformer 18 saturates. At that point, the current transformer 18 is reset into an unsaturated state. Since the magnetizing current generated by the current transformer 18 creates large error at low DC current, the second circuit 13 is added to generate a constant DC offset current so as to minimize the error at low levels of the DC current. Preferably, a core material having a high magnetic permeability is used to improve the electromagnetic coupling efficiency between the primary 12, secondary 14, and offset 13 windings.

The level of offset DC current, $I_{os}$, to be added is determined based on the core of the current transformer 18 and the DC current, $I_p$, flowing through the primary winding 12. The DC offset current must be sufficient to overcome the non-linearity of the core of the current transformer 18. The more linear the measured DC current is desired, the more DC offset current must be added. Furthermore, it is preferred that the current transformer 18 has a turns ratio defined by N:1:n, where N and n are chosen based on the output voltage/current level required for a particular application. Preferably, a high turns ratio is used for the current transformer 18 to increase sensitivity and reduce the power required.

Figure 3:
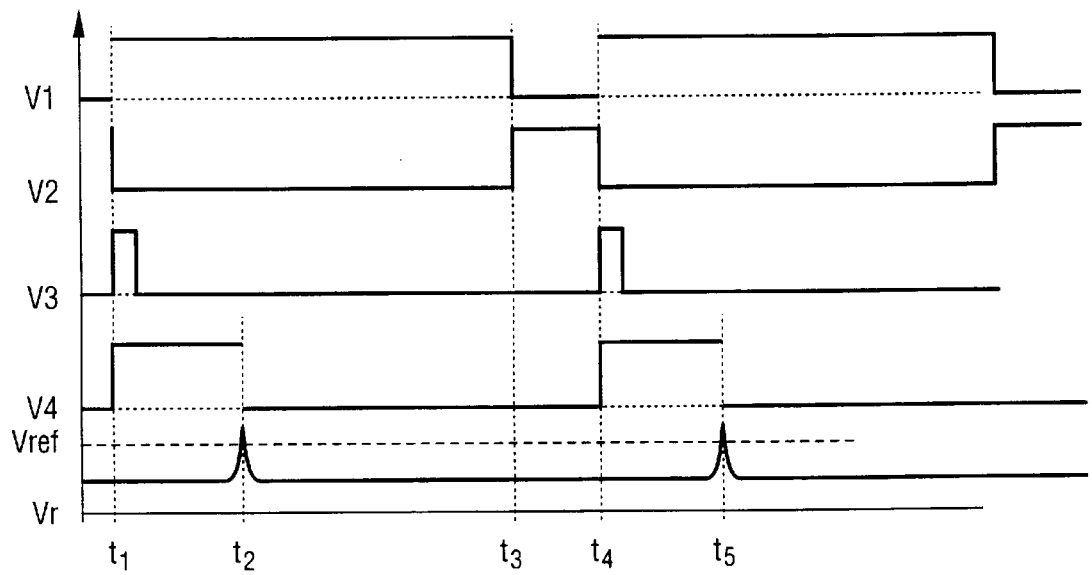
FIG. 3 illustrates key waveforms of the current sensor of the present invention.

Operation of the current transformer 18 is accomplished utilizing external clocking generated by an oscillator 22. A fixed clock signal. ($v_1$) generated by the oscillator 22 is a pulse train having rising edges and falling edges, as shown in FIG. 3. Each rising edge of the fixed clock signal ($v_1$) initiates a new cycle of operation of the current transformer 18 as indicated at times $t_1$ and $t_4$, as shown in FIG. 3.

Coupled to the oscillator 22 is a rising edge one-shot circuit 24 for producing one output trigger pulse ($V_3$) for each rising edge input. The rising edge of this trigger pulse train ($V_3$) is applied to a latching IC (Integrated Circuit) 26 to drive the secondary winding 14 of the current transformer 18 via a pulse train ($v_4$). The latching IC is a standard 4000 level CMOS (Complementary Metal-Oxide Semiconductor), such as a 4043B R-S Latch. A driver 28 may also be provided for following the latching IC 26 to enhance the current handling capability of the latching IC 26. The driver 28 may be any typical driver, such as a UC1708 manufactured by Unitrod Integrated Circuit Corporation.

The latching IC 26 and the driver 28 cause a DC voltage to be applied across the secondary winding 14 of the current transformer 18 until the core of the current transformer 18 saturates. At the same time, while a substantially constant DC current flows through the primary winding 12, the current transformer 18 is generating a DC voltage ($V_r$). Throughout the cycle of operation of the current transformer 18, the DC voltage ($V_r$) remains in a linear relationship with the DC current ($I_p$) flowing through the primary winding 12 until the core begins to saturate.

The DC voltage ($V_r$) is applied to a comparator 30 for comparison with a reference voltage ($V_{ref}$). The reference voltage $V_{ref}$ is selected as a value higher than a steady-state value of $V_r$, e.g., 10–20% higher than $V_r$. When the core begins to saturate, excess magnetizing current causes the DC voltage ($V_r$) to reach the reference voltage ($V_{ref}$) and reset the latching IC 26 wherein the driver 28 pulse train $v_4$ goes low, as shown at times $t_2$ and $t5$ in FIG. 3. At time $t_2$, the current across the secondary winding 14 starts to freewheel through a diode 32 in order to reset the core until the next cycle starts at time $t_4$.

The sampling circuit 16 of the measuring device 15 is coupled to the current transformer 18 for sampling the DC current $I_p$ and the DC offset current $I_{os}$ and providing a corresponding ATM (Analog Telemetry) output signal. The DC current $I_p$ is measured as the DC voltage ($V_r$) across a sense resistor ($R_{sense}$) 34 according to the following equation:

$$V_r = [(I_p + nI_{os})/N] * R_{sense},$$

where $I_p$ is the current flowing through the primary winding 12, n is the number of turns corresponding to the offset winding 13, $I_{os}$ is the constant DC offset current generated across the offset winding 13, and N is the number of turns corresponding to the secondary winding 14. Thus, the DC current $I_p$ can be obtained according to the following:

$$I_p = \frac{V_r * N}{R_{sense}} - nI_{os},$$

wherein the offset DC current $I_{os}$ is filtered from the DC current $I_p$.

To ensure that the DC current is only sampled when the current transformer 18 is in the unsaturated state, a falling edge one-shot circuit 17 is coupled to the sampling circuit 16. The falling edge one-shot circuit 17 produces one output pulse ($v_2$) for each falling edge input (trigger) generated by the oscillator 22 and is reset by each rising edge input generated by the oscillator 22. Thus, the pulse train generated by the falling edge one-shot circuit 17 is inversely related to the pulse train generated by the oscillator 22. The falling edge one-shot pulse ($v_2$) is generated before the rising edge of the fixed clock ($v_1$) at time $t_3$, as shown in FIG. 3, to avoid the saturated period and to trigger the sampling circuit 16. Thus, the sampling circuit 16 measures the DC voltage ($V_r$) before the beginning of every cycle of operation of the current transformer 18 so as to avoid the voltage spike shown in. FIG. 3 at time $t_2$.

The final voltage reading can be compensated by connecting a second resistor ($R_{os}$) 36 to the sampling circuit 16. The second resistor ($R_{os}$) 36 allows the output DC level to be fine tuned.

Figure 4:
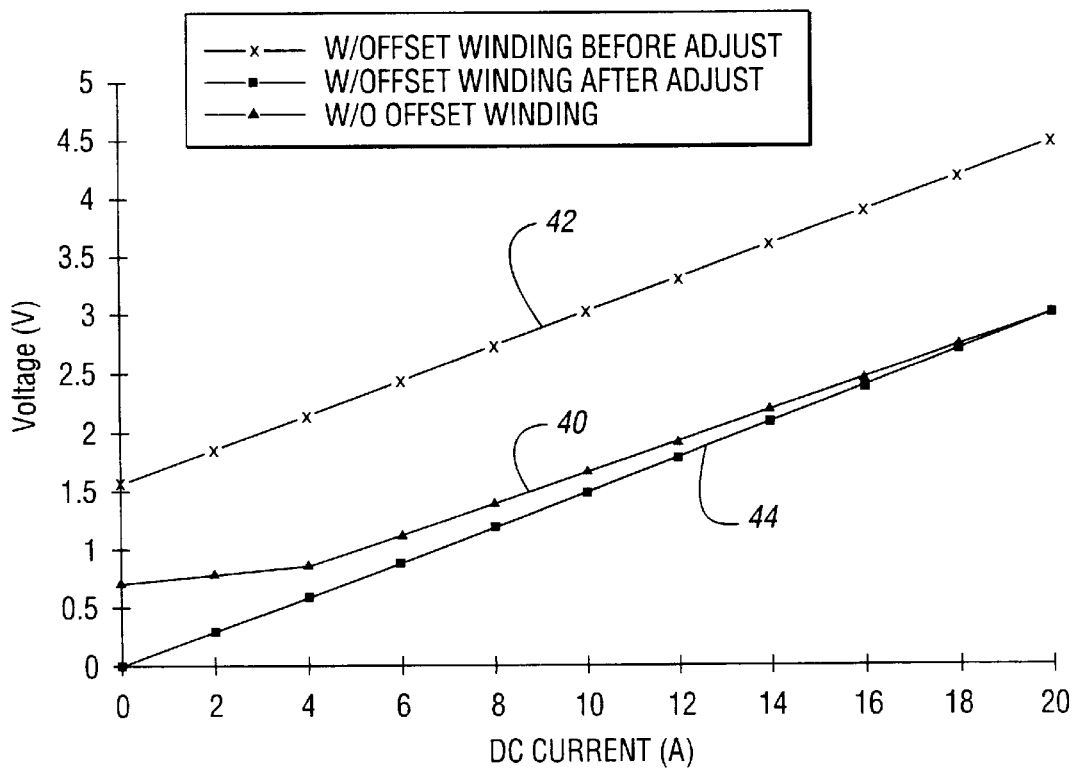
FIG. 4 is a graph illustrating the DC current measured with and without the sensor of the present invention.

Turning now to FIG. 4, there is shown a graph of voltage versus current for test data taken from a prototype. Graph 40 was obtained by not employing the offset winding 13 of the present invention. Graph 40 illustrates the non-linearity of the DC current at low levels of DC current. Graph 42 illustrates the current measured employing the current sensor 10 of the present invention. For this example, the current transformer 18 has a turns ratio of 1000:1:5 in an application that uses 20 amps of DC current. The value of the offset DC current $I_{os}$ was 2.0 amps. The value of the sensed resistor $R_{sense}$ was 150 ohms and the value of the reference voltage $V_{ref}$ was 6.0 volts. By adjusting the measured DC current by subtracting the value of the offset DC current, graph 44 is obtained.

The offset winding 13 of the magnetic current sensor 10 of the present invention assures a minimum DC current level so as to greatly improve output linearity. The present invention, thus, provides accurate current regulation and telemetry readings, especially at low target currents. Also, the power dissipation of the current sensor is greatly reduced.

While the best modes for carrying out the invention have been described in detail, those familiar with the art to which this invention relates will recognize various alternative designs and embodiments for practicing the invention as defined by the following claims.

What is claimed is:

1. A method for measuring a first DC current in a first circuit, the first DC current flowing in a predetermined direction, the method comprising the steps of:

electromagnetically coupling a second circuit to the first circuit for generating a second DC current wherein the second circuit has current flowing in the same direction as the first DC current, the second DC current improving the accuracy of the measurement of the first DC current at low levels of the first DC current;

electromagnetically coupling the first circuit to a third circuit for generating a third DC current representative of the first DC current; and measuring the first DC current based on the third DC current generated by the third circuit comprising for converting the third DC current into a voltage signal with a resistor, wherein the first, second and third circuits comprise a current transformer having primary, offset and secondary windings, respectively, each having a predetermined number of turns, and wherein the step of measuring measures the first DC current in accordance with the following:

$$I_p = (V_r * N) R_{sense} - n * I_{os},$$

where $I_p$ is the first DC current, $V_r$ is the voltage signal, N corresponds to the number of turns in the secondary winding, $R_{sense}$ corresponds to a value of the resistor, n corresponds to the number of turns in the offset winding and $I_{os}$ corresponds to the second DC current.

2. The method as recited in claim 1 wherein the step of measuring includes the step of adjusting the measured first DC current based on the second DC current.

3. The method as recited in claim 1 wherein the step of measuring the first DC current includes the step of sampling the voltage signal during a sampling interval.

4. The method as recited in claim 3 wherein the step of sampling the voltage signal includes the step of controlling the sampling interval so as to obtain an accurate measurement of the first DC current.

5. The method as recited in claim 4 wherein the third circuit has a saturated state and an unsaturated state and wherein the step of controlling the sampling interval includes the step of determining when the third circuit is in the unsaturated state.

6. The method as recited in claim 5 wherein the step of determining includes the step of comparing the voltage signal to a predetermined voltage reference.

7. The method as recited in claim 1 further comprising the step of adjusting a level of the measured first DC current.

8. A sensor for measuring a first DC current in a first circuit, the first DC current flowing in a predetermined direction, the sensor comprising:

a second circuit electromagnetically coupled to the first circuit for generating a second DC current wherein the second circuit has current flowing in the same direction as the first DC current, the second DC current improving the accuracy of the measurement of the first DC current at low levels of the first DC current;

a third circuit electromagnetically coupled to the first circuit for generating a third DC current representative of the first DC current; and a measuring device for measuring the first DC current based on the third DC current having a resistor for converting the third DC current into a voltage signal, wherein the first, second and third circuits comprise a current transformer having primary, offset and secondary windings, respectively, each having a predetermined number of turns, and wherein the measuring device measures the first DC current in accordance with the following:

$$I_p = (V_r * N)/R_{sense} - n * I_{os},$$

where $I_p$ is the first DC current, $V_r$ is the voltage signal, N corresponds to the number of turns in the secondary winding, $R_{sense}$ corresponds to a value of the resistor, n corresponds to the number of turns in the offset winding and $I_{os}$ corresponds to the second DC current.

9. The sensor as recited in claim 8 wherein the measured first DC current is adjusted based on the second DC current.

10. The sensor as recited in claim 8 further comprising a sampling circuit for sampling the voltage signal during a sampling interval.

11. The sensor as recited in claim 10 further comprising a one-shot circuit coupled to the sampling circuit for controlling the sampling interval so as to obtain an accurate measurement of the first DC current.

12. The sensor as recited in claim 11 wherein the third circuit has a saturated state and an unsaturated state and wherein the sensor further comprises:

means for generating a signal operative to cycle the third circuit so as to cause a transition from the unsaturated state to the saturated state and back to the unsaturated state;

means for determining when the third circuit has transitioned into the saturated state; and the one-shot circuit coupled to the generating means for triggering the sampling circuit after the third circuit has transitioned to the saturated state but prior to the next cycle.

13. The sensor as recited in claim 12 wherein the means for generating is an external clock source which generates a pulse train having a plurality of rising edges and a plurality of falling edges.

14. The sensor as recited in claim 13 wherein the external clock source is an oscillator.

15. The sensor as recited in claim 13 further comprising a driving circuit coupled to the external clock source and the third circuit for applying a DC voltage across the third circuit in response to each occurrence of the plurality of rising edges until the third circuit transitions to the saturated state.

16. The sensor as recited in claim 15 wherein the driving circuit comprises:

a rising edge one-shot circuit coupled to the external clock source for generating one output trigger pulse for each of the plurality of rising edges of the pulse train generated by the external clock source; and a latching circuit coupled to the rising edge one-shot circuit and the third circuit for generating an output pulse in response to each of the one output pulses generated by the rising edge one-shot circuit, the output pulse causing a DC voltage to be applied across the third circuit.

17. The sensor as recited in claim 12 wherein the means for determining when the third circuit has transitioned into the saturated state includes means for comparing the voltage signal to a predetermined voltage threshold.

18. The sensor as recited in claim 13 wherein the one-shot circuit triggers the sampling circuit in response to each of the plurality of falling edges of the pulse train generated by the external clock source.

19. The sensor as recited in claim 8 further comprising means for adjusting a level of the measured first DC current.

20. The sensor as recited in claim 19 wherein the adjusting means is a variable resistor.

* * * * *